(12) United States Patent
Lang et al.

(10) Patent No.: US 6,286,365 B1
(45) Date of Patent: Sep. 11, 2001

(54) METHOD FOR DETERMINING SEGMENT TIMES BETWEEN DETECTIONS OF EQUALLY SPACED MARKINGS ON A ROTATING BODY CONNECTED WITH A CAMSHAFT OF AN INTERNAL COMBUSTION ENGINE

(75) Inventors: Tobias Lang, Marbach; Michael Zimmermann, Grossbottwar, both of (DE)

(73) Assignee: Robert Bosch GmbH

( * ) Notice: Subject to any disclaimer, the term of this patent is extended or adjusted under 35 U.S.C. 154(b) by 0 days.

(21) Appl. No.: 09/284,116

(22) PCT Filed: Jul. 16, 1998

(86) PCT No.: PCT/DE98/01994
§ 371 Date: Jun. 14, 1999
§ 102(e) Date: Jun. 14, 1999

(87) PCT Pub. No.: WO99/07987
PCT Pub. Date: Feb. 18, 1999

(30) Foreign Application Priority Data

Aug. 9, 1997 (DE) .............................. 197 34 595

(51) Int. Cl.⁷ .................. G01L 3/26; G01L 5/13; G01M 15/00
(52) U.S. Cl. .............................................. 73/116
(58) Field of Search .................. 73/116, 117.3; 123/436

(56) References Cited

U.S. PATENT DOCUMENTS

| 5,325,833 | * | 7/1994 | Fukui et al. | 123/414 |
| 5,377,535 | * | 1/1995 | Angermaier et al. | 73/116 |
| 5,554,802 | * | 9/1996 | Fukui et al. | 73/117.3 |

* cited by examiner

Primary Examiner—Benjamin R. Fuller
Assistant Examiner—Octavia Davis
(74) Attorney, Agent, or Firm—Michael J. Striker

(57) ABSTRACT

The method for determining segment times ($T_k$) required for controlling an internal combustion engine includes providing a transducer disk (17) connected to a camshaft of the engine with a plurality of markings equally spaced from each other on the transducer disk; measuring respective segment times ($T_k$) between detection of corresponding pairs of markings on the transducer disk (17) by means of a camshaft sensor (21); triggering fuel injection events and combustion events in order to trip acceleration events at a substantially constant camshaft rotation speed; determining a resulting acceleration quotient ($Q_k$) for a current segment time as a quotient of the current segment time divided by a preceding segment time and correcting a following segment time by means of the acceleration quotient ($Q_k$) for the current segment time. The method is not performed when the internal combustion engine has a crankshaft with a properly working crankshaft sensor for measuring crankshaft rotation speed.

9 Claims, 2 Drawing Sheets

METHOD FOR DETERMINING SEGMENT TIMES BETWEEN DETECTIONS OF EQUALLY SPACED MARKINGS ON A ROTATING BODY CONNECTED WITH A CAMSHAFT OF AN INTERNAL COMBUSTION ENGINE

BACKGROUND OF THE INVENTION

1. Field of the Invention

The present invention relates to a method of determining respective segment times between corresponding pairs of equally spaced marks provided on a rotating body, especially a transducer disk, connected to a camshaft of an internal combustion engine.

2. Prior Art

For regulating internal combustion engines, the rpm of the crankshaft and/or camshaft of the engine is always needed. From the position of these shafts, when trigger signals for certain components must be generated can be determined. For example, the time when current must be supplied to a particular injection valve so that the most optimal possible combustion event can proceed in the associated cylinder is dependent on the position of the crankshaft and/or camshaft of a Diesel engine.

To determine the angular position of the crankshaft and/or camshaft of an internal combustion engine, sensors are typically used that each scan a transducer wheel connected to the crankshaft and the camshaft, respectively. The two transducer wheels typically have a characteristic sequence of angle markings or slits on their circumference. As these angle markings or slits move past the stationary sensors, voltages are induced in the sensors, and from the course of these voltages over time, the surface area of the applicable transducer disk can be derived. The sensor voltages are typically converted into square-wave signals to make them easier to evaluate. The position of each of the signal edges corresponds to a certain rpm of the crankshaft or camshaft.

In Diesel engines currently in use, the transducer disk connected to the crankshaft, in a rotating cylinder engine, has 60-3·2 teeth, and the distribution of the teeth or angle markings is such that three gaps are formed, and between each two gaps there are 18 teeth, spaced apart by equal angles from one another. The disk connected to the camshaft has six slits, for six cylinders, and the slits are spaced apart by equal angles. A seventh slit is disposed between the first and second slits and serves as a reference marking; it is only slightly distant from the first slit, for instance by a camshaft angle of 15°.

When the engine is started, it is brought to a starting rpm with the aid of a starter. The crankshaft and the camshaft then rotate at a relatively constant rpm; it is well known that the crankshaft rotates at twice the speed of the camshaft. No later than after one revolution of the camshaft, a synchronization can be effected, since the seventh tooth is recognized as the synchronizing tooth. From this instant on, during normal operation, the correct injection can be begun. The requisite trigger signals are output by the engine control unit, which processes the output signals of the sensors. For instance, the engine control unit trips the delivery of current to the injection valves or the onset of pumping at the correct instant, thus enabling optimal regulation of the engine. Since the transducer disk on the crankshaft has many teeth, a signal is produced that has pulses in rapid succession; exact engine regulation is thus possible, in the normal situation. If under unfavorable conditions the crankshaft sensor fails, emergency operation should be possible with the camshaft sensor alone.

SUMMARY OF THE INVENTION

It is an object of the present invention to enable reliable starting and continued operation of the engine without a crankshaft signal, especially in starting. It is also the object of the invention however, to disclose a general method in which reliable engine regulation, especially in starting, can be performed using a relatively coarse angle signal.

This object is attained by a method for determining segment times required for controlling an internal combustion engine provided with a camshaft, the method comprising the steps of:

a) providing a transducer disk connected to the camshaft with a plurality of markings on it which are equally spaced from each other around the transducer disk so that the transducer disk rotates with the camshaft;

b) measuring respective segment times between corresponding pairs of the markings on the transducer disk by means of a camshaft sensor;

c) triggering corresponding fuel injection events and thus combustion events in the internal combustion engine in order to trip acceleration events at a substantially constant camshaft rotation speed; and d) determining, in response to the triggering of step c), a resulting acceleration quotient for a current segment time, this acceleration quotient equaling the current segment time divided by a formerly measured segment time immediately prior to the current segment time; and e) correcting a following segment time obtained during the measuring by means of the acceleration quotient for the current segment time.

The method however is not performed when the internal combustion engine has a crankshaft with a crankshaft sensor for measuring crankshaft rotation speed and a crankshaft sensor signal from the crankshaft sensor is detected.

The method according to the invention for determining segment times has the advantage that in conjunction with a conventional internal combustion engine control unit, it enables reliable engine regulation even in the absence of a crankshaft sensor signal, and that particularly in starting it enables fast, accurate determination of trigger pulses. In simple engines that have only a transducer disk connected to the camshaft, fast and reliable regulation is also possible, and again this is especially true for starting.

These advantages are attained in that the segment times, which are determined in accordance with the chronological spacing between two markings spaced apart by the same angle from one another; in starting, at a substantially constant rpm, a first acceleration event is first tripped, and the associated segment time $T_k$ and the associated acceleration quotient $Q_k$ are calculated, and after that two further acceleration events are tripped, and the first acceleration event is taken into account by means of the first, adapted acceleration quotient, while the second acceleration event is determined from a newly determined segment time. After that, three successive acceleration events are tripped, and the rpm change in the first two acceleration events is determined with the aid of the acceleration quotient, while the third acceleration event is again determined from the associated segment time. After that, a dynamic correction of the expected segment times can be performed.

Further advantages of the invention are attained by the provisions recited in the dependent claims. It is especially advantageous that the acceleration phases are tripped by supplying current to the selectable injection valve or injection valves. In conventional engines, the method of the invention can advantageously be performed as an emergency operation provision, if the crankshaft incremental sensor is defective. In simple systems, which have only a low-resolution transducer, an improvement in the accuracy of control is achieved with the method of the invention, because acceleration-dictated changes in the rpm can be detected and compensated for or adapted.

BRIEF DESCRIPTION OF THE DRAWING

An exemplary embodiment of the invention is shown in the drawing and will be described in further detail in the ensuing description.

DETAILED DESCRIPTION OF THE INVENTION

Figure 1:
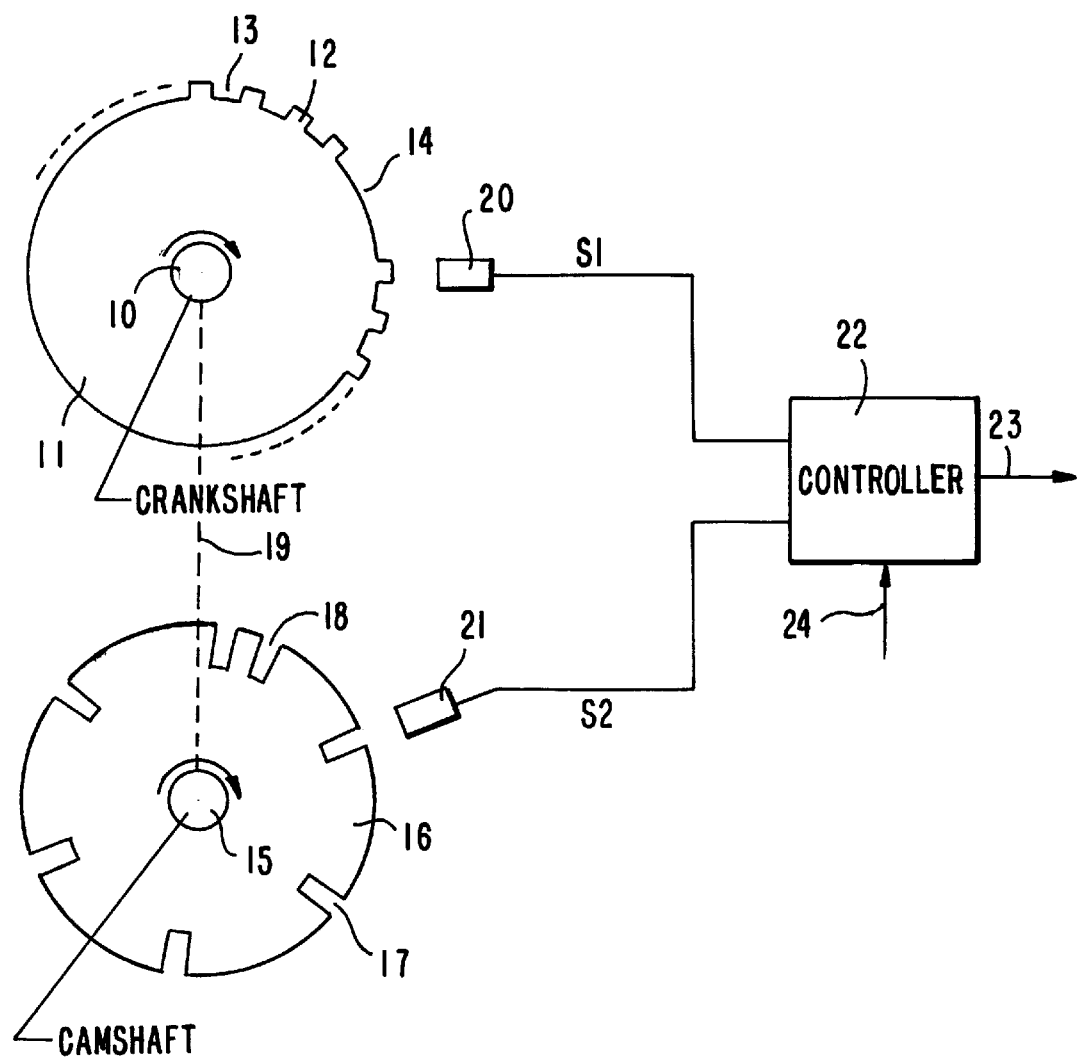
FIG. 1 is a diagrammatic view of components of an internal combustion engine that are needed to perform the method of the invention.

FIG. 1 shows the components of an internal combustion engine that are needed for comprehension of the invention. In detail, reference numeral 10 indicates the crankshaft of the internal combustion engine, and 11 a transducer disk connected to the crankshaft 10; on its circumference, the transducer disk has many angle markings 12, which are spaced apart from one another by an angular spacing 13. At least one of the spacings between two identical angle markings is larger and corresponds for instance to two missing angle markings.

The camshaft 15 has a transducer disk 16, which has slits 17 on its circumference that have the same spacing from one another. In addition, there is a further slit 18, which is used for synchronization and is approximately 15° away from one of the regular slits 17. For the exemplary embodiment of a six-cylinder internal combustion engine shown in FIG. 1, there are typically six slits 17 and three reference markings 14.

The crankshaft and the camshaft are connected to one another via a drive mechanism 19. The camshaft 15 typically rotates at half the speed of the crankshaft 10.

For scanning the two transducer disks 11, 16, stationary sensors 20, 21, for instance inductive sensors, are provided, which furnish an output signal S1, S2, which a signal processing has a course that corresponds to the surface structure of the two transducer disks. The evaluation of the signals S1 and S2 is done in the control unit 22 of the engine, which in a known manner includes both at least one microprocessor and suitable memory means. As a function of the signals S1, S2 furnished by the sensors 20, 21, the control unit 22 calculates trigger pulses, for instance for delivering current to the injection valves or for the onset of fuel pumping. These trigger signals are delivered to the various components via connections 23. Via connections 24, the control unit 22 can be supplied with additional information about the engine operating state or about the surroundings in which the engine is located. This additional information can be taken into account in calculating the trigger signals and is furnished by suitable sensors, for instance.

With the engine components shown in FIG. 1, regulation of the engine can be performed, for a given functionality of the two sensors 20 and 21. After the engine is started, the crankshaft and the camshaft are first brought, by a starter, not shown, to a constant rpm. Rotating the transducer disks 11, 16 generates signals in the sensors 20, 21, and from the chronological succession of the signals, the rpm of the crankshaft or camshaft can be determined, and as a consequence of the characteristic pulse trains, synchronization can be done, at the latest after one revolution of the camshaft, which means after two revolutions of the crankshaft, so that in the control unit 22, an unequivocal association between the crankshaft and the camshaft is known. Thus the position of the cylinders is also known, and the trigger signals needed, for instance for the injection, or for the ignition in the case of an engine with externally supplied ignition, can be output.

If a defect occurs in the sensor 20 that scans the incremental sensor 11 connected to the crankshaft, the control unit receives information only from the sensor 21. If this defect already appears when the engine is started, then to carry out emergency operation, the method of the invention is performed in the control unit, or in other words in the microprocessor of the control unit 22.

The method of the invention will now be explained in terms of an adaptive segment time determination in a Diesel engine, for the case where the engine is put into operation with a defective crankshaft sensor. In that case, emergency operation can be achieved only from the information, furnished to the sensor 21, about the position of the camshaft. The acceleration events are tripped in that during starting, once the engine has been brought to a substantially constant speed by the starter, a targeted magnet valve triggering is tripped, and the acceleration that ensues after the first delivery of current to it is determined.

In general, during staring without an incremental sensor signal, approximate information about the current angular position of the camshaft and thus of the crankshaft as well is indeed available, but the exact angular positions are not known, and so the magnet valves after the initial ignitions are supplied with current at the wrong instant. The reason for this is that the segment signal furnishes only seven pulses per camshaft revolution. Emergency starting cannot be done in that case, especially at low temperatures.

Figure 2:
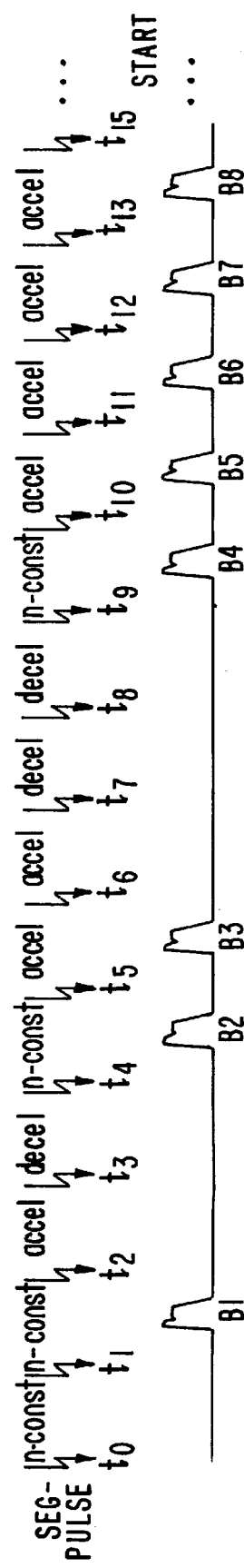
FIG. 2 shows method-oriented signals, including the associated times, in a method for emergency starting in the absence of a crankshaft sensor signal according to the invention.

In FIG. 2, the procedure according to the invention for emergency starting without a crankshaft sensor signal is plotted. An arrow indicates the segment pulses (SEG pulses) generated by the camshaft sensor 21. Synchronization has taken place, but the synchronization pulse is not shown. The times at which the segments appear are marked $t_x$, where x ranges from 0 to 15. Between the segment pulses, which are 60° apart in terms of the camshaft angle, information on the camshaft rpm is plotted, showing the following options: rpm n approximately constant (n-const.); acceleration (accel.); and deceleration (decel.). The delivery of current to one or more magnet valves is shown in the lower portion of FIG. 2. This delivery of current takes place between each two segment pulses. It is correct for a specific cylinder, but is still imprecise at first; nevertheless, it does lead to an injection and thus to a combustion event and to an acceleration of the camshaft. Instead of a delivery of current, the control unit can also output some other trigger signal, via the connection 23, that leads to combustion and thus to acceleration of the camshaft.

In terms of the graph in FIG. 2, the camshaft rotates at approximately constant rpm between $t_0$ and $t_1$, and between $t_1$ and $t_2$. It is brought to this rpm with the aid of the starter. The first current delivery B1 causes an acceleration. Between the segment pulses $t_2$ and $t_3$, the camshaft is accelerated. For system-dictated reasons, a deceleration, i.e., a drop in the rpm, occurs again between the segment pulses $t_3$ and $t_4$. The periods of time between the times $t_0$ and $t_1$, $t_1$ and $t_2$, etc. are called the segment time $T_k$. These times are each calculated by the engine control unit, in accordance with the equation $T_k = t_k - t_{k-1}$.

Along with the segment time, an acceleration quotient is formed, which is determined only in those time intervals when an acceleration has actually occurred. After the current delivery B1, the acceleration quotient $Q_k=T_k/T_{k-1}$ is thus determined, in which case $Q_3=T_3/T_2$. The associated segment times are $T_3=t_3-t_2$, and $T_2=t_2-t_1$. The acceleration coefficient $Q_3$ thus calculated is stored in memory and taken into account in the next segment time adaptation.

As soon as the control unit recognizes that the rpm is again constant, a second current delivery B2 of an injection valve is triggered; this leads to injection of fuel and thus to combustion and hence acceleration. After the next segment pulse, a further current delivery B3 is effected, once again producing an acceleration. Since from the first determination of the acceleration quotient $Q_3$ the acceleration for a current delivery is known, it is possible at time $t_5$ to calculate the equation $T_6=T_5 \cdot Q_3$. This acceleration occurs as a result of the current delivery B2. After a further current delivery B3, after which fuel is injected into the next cylinder, a further acceleration occurs. The associated acceleration coefficient $Q_7$ is calculated by the equation $Q_7=T_7/T_6$. The two current deliveries B2 and B3, which each lead to two accelerations and two decelerations, lead in the end to adapted segment times $T_{k+x}=T_{k+x-1} \cdot Q_k$.

Once the adapted segment time can be determined, three successive current deliveries B4, B5 and B6 are next performed; beginning at instant $t_{10}$, these lead to three successive accelerations. The course of acceleration is now known. At instant $t_{10}$, the segment time can be calculated, by the equation $T_{11}=T_{10} \cdot Q_3$, and at instant $t_{11}$ the segment time $T_{12}$ can be calculated, but the equation $T_{12}=T_{11} \cdot Q_7$. After the injections and successful ignitions, which are effected by the current deliveries B4, B5 and B6 and have led to three accelerations, it is possible at instant $t_{13}$ to trip further accelerations, i.e., injections, which lead to a runup of the rpm; in the process, a go transition to a conventional dynamic correction of the segment time is made, with which the rpm increase is then compensated for. This conventional segment time correction is done by the formula.

With the adaptive segment time determination described, a dynamic correction of the expected segment time $T_{k+1}$ can thus be done, and the wrong segment times after the first and second ignition during starting, which were calculated with the dynamic correction, can in turn be corrected. The acceleration quotients $Q_k$ are therefore adapted and used for correcting the segment time. In engine starting, the segment time is accordingly calculated by the equation $T_{k+x}=T_{k+x-1} \cdot Q_k$.

The segment times, the acceleration quotients, and the adapted segment times are all sorted in memory means of the control unit 22, as long as they are needed for calculation purposes. The end of the adaptive segment time correction is signalled to the control unit computer by a status display, for example.

The method of the invention has been explained in terms of a Diesel engine. It can be extended in principle to other internal combustion engines as well; in that case, the acceleration events are tripped by actuation of the injection valves and injection of fuel into the cylinders. In simpler engines, which include only one segment disk connected to the camshaft, the method of the invention can be used not only as an emergency operation method but also as a general, simplified method. The preferred embodiment, however, is its use in a modern internal combustion engine in the event of a failure of the crankshaft incremental sensor, to enable emergency operation and in particular also to enable reliable engine starting if the crankshaft sensor is defective.

What is claimed is:

1. An emergency method for determining segment times required for controlling an internal combustion engine, wherein said internal combustion engine includes a camshaft (15); a transducer disk (16) fixed on said camshaft and provided with a plurality of equal-spaced markings; a camshaft sensor (21) for detecting said equal-spaced markings on the transducer disk (16); a crankshaft (11), another transducer disk (11) fixed to said crankshaft and provided with markings spaced apart from each other on said another transducer disk (11) and a crankshaft sensor (20) for detecting said markings spaced apart from each other on the another transducer disk (11), said method comprising the steps of:
   a) testing to determine if a crankshaft sensor signal is being generated by said crankshaft sensor (20);
   b) only if said crankshaft sensor signal is not detected during the testing of step a), measuring respective segment times between pairs of said equally-spaced markings on said transducer disk (16) fixed to said camshaft by means of said camshaft sensor (21);
   c) triggering fuel injection events and thus combustion events in said internal combustion engine in order to trip acceleration events at a substantially constant rotation speed of said camshaft (15);
   d) calculating, in response to the triggering of step c), a resulting acceleration quotient for a current one of said segment times, said acceleration quotient equaling said current one of said segment times divided by a formerly measured one of said segment times; and
   e) correcting a following one of said segment times obtained during the measuring by means of said acceleration quotient for said current one of said segment times;
   whereby reliable starting and continued operation of the internal combustion engine are provided without a crankshaft signal.

2. The emergency method as defined in claim 1, further comprising the step of calculating said following one of said segment times as a product of said current one of said segment times and said acceleration quotient for said current one of said segment times.

3. The emergency method as defined in claim 1, wherein said internal combustion engine has a control unit and further comprising the steps of determining whether or not said camshaft has said substantially constant rotation speed by means of said control unit and performing said triggering of said fuel injection events by means of controls signals generated by said control unit when said camshaft has said substantially constant rotation speed.

4. The method as defined in claim 1, further comprising the steps of measuring a resultant one of said segment times in response to a first of said acceleration events, calculating the acceleration quotient for said resultant one of said segment times, subsequently performing said tripping of two additional ones of said acceleration events and determining a first acceleration contribution of said first of said acceleration events from a previously calculated acceleration quotient and a second acceleration contribution from a ratio of the current one of said segments times to a preceding one of said segment times.

5. The emergency method as defined in claim 4, further comprising the steps of performing said tripping of further ones of said acceleration events and performing a dynamic correction of said segment times.

6. A method for determining segment times required for controlling an internal combustion engine, wherein said internal combustion engine includes a camshaft; a transducer disk fixed on said camshaft and provided with a plurality of equal-spaced markings; a camshaft sensor for detecting said equal-spaced markings on the transducer disk, but does not include a crankshaft sensor, said method comprising the steps of:

a) measuring respective segment times between pairs of said equally-spaced markings on said transducer disk fixed to said camshaft by means of said camshaft sensor;

b) triggering fuel injection events and thus combustion events in said internal combustion engine in order to trip acceleration events at a substantially constant rotation speed of said camshaft;

c) calculating, in response to the triggering of step b), a resulting acceleration quotient for a current one of said segment times, said acceleration quotient equaling said current one of said segment times divided by a formerly measured one of said segment times; and d) correcting a following one of said segment times obtained during the measuring by means of said acceleration quotient for said current one of said segment times; whereby reliable starting and continued operation of the internal combustion engine are provided without a crankshaft signal.

7. The method as defined in claim 6, further comprising the step of calculating said following one of said segment times as a product of said current one of said segment times and said acceleration quotient for said current one of said segment times.

8. The method as defined in claim 6, wherein said internal combustion engine has a control unit and further comprising the steps of determining whether or not said camshaft has said substantially constant rotation speed by means of said control unit and performing said triggering of said fuel injection events by means of controls signals generated by said control unit when said camshaft has said substantially constant rotation speed.

9. The method as defined in claim 6, further comprising the steps of performing said tripping of further ones of said acceleration events and performing a dynamic correction of said segment times.

* * * * *